United States Patent [19]

Thomsen

[11] 4,100,368

[45] Jul. 11, 1978

[54] CAPTIVE STANDOFF CONNECTOR

[75] Inventor: Jack W. Thomsen, La Grange Park, Ill.

[73] Assignee: Weckesser Company, Inc., Chicago, Ill.

[21] Appl. No.: 757,630

[22] Filed: Jan. 7, 1977

[51] Int. Cl.[2] .................... H01B 17/24; H05K 7/12; F16B 5/00

[52] U.S. Cl. .................... 174/138 D; 361/412; 361/420

[58] Field of Search .......... 174/138 R, 138 D, 138 G, 174/153 R, 153 G, 158 R; 361/400, 403, 412, 415, 417, 418, 419, 420

[56] References Cited

FOREIGN PATENT DOCUMENTS 2,269,783 11/1975 France .................... 174/138 D

*Primary Examiner*—Laramie E. Askin

[57] ABSTRACT

A bolt-receiving standoff connector especially suited for use as a spacer in separating or stacking electrical or electronic components, such as printed circuit boards or in any applications that require electrically isolating components while rigidly mounting the same to a support, chassis, or case, the standoff being constructed from non-conductive material, such as plastic or other like material possessing the required physical characteristics.

2 Claims, 5 Drawing Figures

CAPTIVE STANDOFF CONNECTOR

SUMMARY OF THE INVENTION

It is an object of this invention to provide a captive spacer commonly known as a "standoff," adapted to be associated with apertured frame members, whereby the latter may be stacked in spaced relation and electrically isolated from each other while at the same time being rigidly connected together.

The captive standoff of this invention provides a circular bushing adapted to be placed coaxially with respect to the aperture in a frame member and providing a washer type body of a diameter greater than that of the aperture formed in the frame member, which provides an inner bore adapted to receive an insert bearing of a diameter equal to that of the aperture in the frame member that is projected therethrough into the bushing so as to capture the frame member therebetween. The bushing and bearing member provide coaxial passages therethrough to receive and threadably hold a bolt so as to connect the same together with the frame member captured therebetween.

It is an object of this invention to provide a captive standoff connector formed from plastic or other like material which possesses the necessary degree of rigidity and flexibility such that the principal object of the invention may be achieved thereby. In this regard, the standoff or bushing member is formed with a predetermined circular diameter, which in turn is connected by a flexible strap member to an internally threaded bearing, the major portion of which, in its normal formed condition, extends in an opposite direction to the circular bushing but which, through the flexible strap, may be reversely bent around an exposed edge of a frame member or the like so that the latter may be projected into the center bore of the bushing where it may threadably receive a connecting bolt.

GENERAL DESCRIPTION

The invention will be best understood by reference to the accompanying drawing which shows the preferred form of the invention by which the stated objects are achieved, and in which.

The captive standoff connector is designed to eliminate mounting problems and to simplify installation in a wide variety of electrical and electronic applications. It is especially useful as a spacer for spacing and stacking electrical circuit boards and for any type of application that requires components to be rigidly mounted and at the same time electrically isolated. Being non-conductive, it may also be used for insulating circuit boards and components from metal chassis, cabinets, of the like.

Figure 1:
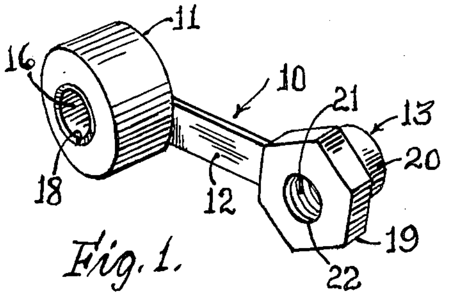
FIG. 1 is a perspective view of the captive standoff connector.

The captive standoff connector 10, as viewed in FIG. 1, comprises a circular bushing 11 having extending radially therefrom a substantially flat strap portion 12 which in turn connects to a portion of a bolt-receiving member 13.

Figure 2:
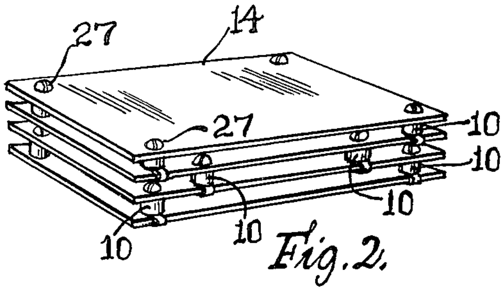
FIG. 2 is a perspective view of a plurality of captive standoff connectors associated with respect to each other and associated frame members whereby the objects of the invention are achieved.

As shown in FIG. 2, the captive standoff connectors 10 are shown in application whereby they are employed to electrically isolate but rigidly connect together a series of printed circuit boards 14.

Figure 5:
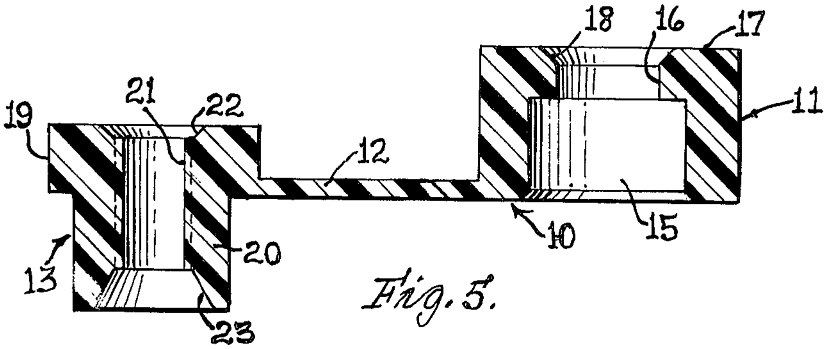
FIG. 5 is a detailed sectional side elevational view of the captive standoff connector taken on line 5—5 of FIG. 3.

The captive standoff connector 10 provides a circular bushing 11 extending in an elevated relation to the strip 12 as viewed in FIG. 5, with the bushing 11 having formed generally therethrough a center bore 15, with the bore extending from the lower protracted edge of the strap 12 inwardly of the busing 11 until it engages a counterbore 16 having a diameter less than that of the center bore 15, with the reduced bore 16 having an emergence to the opposite outer surface 17 of the bushing 11 by way of a circumferentially flared entrance 18.

Figure 3:
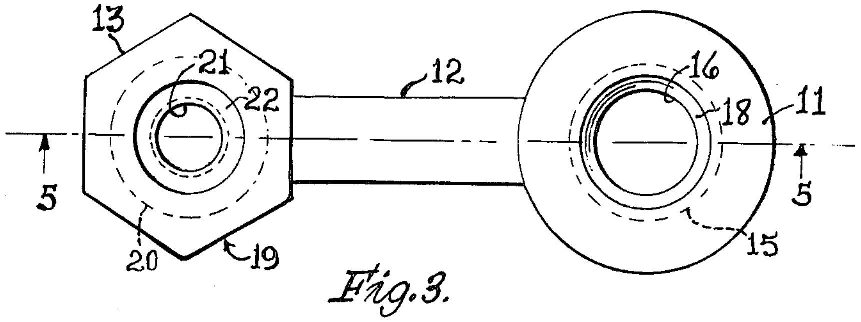
FIG. 3 is a top plan view of the captive standoff connector.

At the opposite extreme end of the strap 12 is the bearing 13 which provides a preformed tool-engaging peripheral surface 19 to the same side of the strap 12 as is the bushing 11. This tool-engaging surface 19 may consist of multiple sides, as shown in plan view in FIG. 3, whereby the same may have tool engagement so as to prevent rotation thereof for the purpose hereinafter stated. The bearing body 20 of the bearing 13 is of a diameter equal to that of the center bore 15 of the bushing 11 and provides with the tool-engaging surface 19 a threaded center bore 21, which provides at opposite ends thereof flared entrances 22 and 23.

In application and for purposes of illustration, reference is made to FIG. 2 wherein it is seen that the printed circuit boards 14 are arranged in stacked relation. Each of the circuit boards 14 is provided with a plurality of apertures 24 of a diameter equal to the diameter of the bearing body 20 (see FIG. 4). It is thus apparent that the captive standoff connectors 10 may be strategically positioned to perform the function required thereof.

Figure 4:
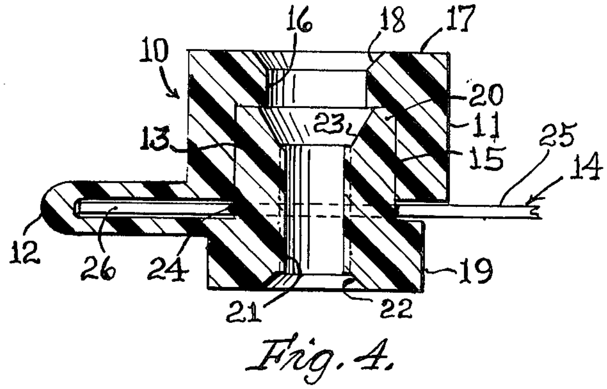
FIG. 4 is a fragmentary sectional detail view of the captive standoff connector as employed in FIG. 2.

Referring to FIG. 4, the captive standoff connector 10 is shown in its operative position. As such, the bushing 11 has been placed on one surface 25 of the plate 14 so that the bore 15 thereof encircles the aperture 24 formed in the plate 14. The strap 12 is looped over the free edge 26 of the plate 14, and the bearing body 20 of the bearing 13 is projected through the aperture 24 formed in the plate 14 and into the center bore 15 of the busing 11 to become frictionally captured therein.

In such a position, the entranceway 23 to the threaded center bore 21 of the bearing 13 is axially aligned with the center bore 15 as well as the counterbore 16 of the bushing 11, such that it is in a position to receive the threaded shank of a connecting bolt 27 used to connect the bushing 11 and the bearing 13 together in a captive position about the edge 26 of a plate 14.

The application of the captive standoff connector 10 as heretofore described, permits the rigid stacking or mounting of a plurality of circuit boards 14 in an electrically isolated condition, such as shown in FIG. 2. It is pointed out, however, that the application of the captive standoff connector 10 is not limited to such an application, but may be utilized to connect an electric motor to a mounting plate or to connect any component rigidly to a mounting plate, while at the same time electrically isolating the components from one another.

It is apparent that in some applications of the captive standoff connector as heretofore described, it may be used in sites where it is required that the strap 12 may be severed before or after application. The severing of the strap 12, however, does not affect the captivity of the bearing 13 in the bushing 11.

While I have illustrated and described the preferred form of construction for carrying my invention into effect, this is capable of variation and modification without departing from the spirit of the invention. I, therefore, do not wish to be limited to the precise details of construction set forth, but desire to avail myself of such variations and modifications as come within the scope of the appended claims.

Having thus described my invention, what I claim as new and desire to protect by Letters Patent is:

1. A captive standoff formed from dielectric material for cooperating with a threaded connector to rigidly mount together apertured components in spaced or stacked electrical isolated relationship, comprising (a) an elongated substantially flat flexible strap, (b) a circular bushing formed integral with said strap at one end thereof and extending laterally from one flat side surface thereof, (c) said circular bushing having an outer diameter greater than the aperture formed in the components and provided with an axial bore extending therethrough, (d) a bearing formed integral with said strap at its opposite end and providing portions of different sizes extending laterally from opposite flat side surfaces of said strap, (e) one of said portions of said bearing having an outer diameter equal to the diameter of said axial bore formed through said circular bushing whereby said portion of said bearing may be projected into said axial bore of said bushing, (f) said other portion of said bearing having a peripheral surface larger than the diameter of said axial bore formed in said circular bushing as well as the aperture formed in the component so as to connect said captive standoff to the apertured component when said firstmentioned portion of said bearing is projected into said axial bore of said circular bushing, (g) said bearing having a threaded bore extending therethrough and adapted to threadably receive the threaded connector when the same is projected through said axial bore formed in said circular bushing and into the threaded bore of said bearing for connecting said bearing to said bushing and the apertured component therebetween.

2. A captive standoff as defined by claim 1 wherein the other of said portions of said bearing provides a performed tool engaging peripheral surface whereby said bearing may be retained in place within said circular bushing when a threaded connector is threaded through said threaded bore of said bearing.

* * * * *